(12) United States Patent
Chiu et al.

(10) Patent No.: US 9,282,631 B2
(45) Date of Patent: Mar. 8, 2016

(54) CIRCUIT WITH FLAT ELECTROMAGNETIC BAND GAP RESONANCE STRUCTURE

(71) Applicants: GLOBAL UNICHIP CORPORATION, Hsinchu (TW); TAIWAN SEMICONDUCTOR MANUFACTURING CO., LTD., Hsin-Chu (TW)

(72) Inventors: Po-Wei Chiu, Miaoli County (TW); Yi-Jung Liu, Hsinchu (TW); Ling-Chih Chou, Taipei (TW)

(73) Assignees: GLOBAL UNICHIP CORPORATION, Hsinchu (TW); TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 39 days.

(21) Appl. No.: 14/451,842

(22) Filed: Aug. 5, 2014

(65) Prior Publication Data
US 2015/0041185 A1 Feb. 12, 2015

(30) Foreign Application Priority Data

Aug. 9, 2013 (TW) .............................. 102128718 A

(51) Int. Cl.
| | |
|---|---|
| *H04B 3/28* | (2006.01) |
| *H05K 1/02* | (2006.01) |
| *H01P 1/20* | (2006.01) |
| *H05K 1/16* | (2006.01) |

(52) U.S. Cl.
CPC ............ *H05K 1/0236* (2013.01); *H01P 1/2005* (2013.01); *H05K 1/165* (2013.01); *H05K 2201/09309* (2013.01)

(58) Field of Classification Search
CPC ................ H05K 1/0236; H05K 1/165; H05K 2201/09309; H01P 1/2005
USPC ........................................................... 333/12
See application file for complete search history.

(56) References Cited

U.S. PATENT DOCUMENTS 7,936,232 B2 * 5/2011 Song et al. ........... H01Q 15/006
333/12

FOREIGN PATENT DOCUMENTS

| TW | I318851 | 7/2008 |
| TW | I369164 | 11/2008 |

OTHER PUBLICATIONS

Telesphor Kamgaing et al., "Design and Modeling of High-Impedance Electromagnetic Surfaces for Switching Noise Suppression in Power Planes", IEEE Transactions on Electromagnetic Compatibility, vol. 47, No. 3, Aug. 2005.

(Continued)

*Primary Examiner* — Robert Pascal
*Assistant Examiner* — Kimberly Glenn
(74) *Attorney, Agent, or Firm* — WPAT, P.C.; Justin King

(57) ABSTRACT

Circuit with flat electromagnetic band gap resonance structure, includes a plurality of flat units formed at a conductor layer; each flat unit spirally revolves inward from a first end to an internal point following a rotation direction, and spirally revolves outward from the internal point to a second end following an opposite rotation direction. Each flat unit is connected to a ground plane by a conductive stand (e.g., a via) at a connection point, for suppressing noise resonances at certain frequencies, and the frequencies are related to a stub length of each flat unit, and the stub length is related to a route length from the connection point to an end.

10 Claims, 10 Drawing Sheets

(56) References Cited

OTHER PUBLICATIONS

Chien-Lin Wang et al., "A Systematic Design to Suppress Wideband Ground Bounce Noise in High-Speed Circuits by Electromagnetic-Bandgap-Enhanced Split Powers", IEEE Transactions on Microwave Theory and Techniques, vol. 54, No. 12, Dec. 2006.

* cited by examiner

CIRCUIT WITH FLAT ELECTROMAGNETIC BAND GAP RESONANCE STRUCTURE

This application claims the benefit of Taiwan application Serial No. 102128718, filed Aug. 9, 2013, the subject matter of which is incorporated herein by reference.

FIELD OF THE INVENTION

The present invention relates to a circuit with flat (planar) electromagnetic band gap resonance structure, and more particularly, to a circuit which includes a plurality of flat units, and has advantages such as low cost, easy design, effective suppression of resonance frequency (or frequencies) between power plane and ground plane, and flexibility to tune resonance frequency (or frequencies) by mixing flat units of different configurations.

BACKGROUND OF THE INVENTION

Electric circuit is the most essential hardware foundation of contemporary information society. Semiconductor electric circuit may be packaged on a substrate to form an integrated circuit (IC), such as a chip, a die or an SOC (System On Chip), etc. Different integrated circuits may further be jointly installed on a common circuit board (e.g., printed circuit board) to form an electronic product, wherein a semiconductor electric circuit may output signals (e.g., streams, information, packages, data, messages, and/or commands, etc.) via its package substrate and the common circuit board, and/or receive signals via the circuit board and its package substrate. Also, an electric circuit may need to drain supply power for operation, i.e., power delivered between a supply voltage and a ground voltage, via its package substrate and the circuit board. To transmit supply power for an electric circuit, its package substrate may include a power plane and a ground plane respectively for coupling the supply voltage and the ground voltage; similarly, the circuit board may also include its own power plane and ground plane.

However, a structure formed by power plane and ground plane has intrinsic electromagnetic resonance frequency (or frequencies); if noise (e.g., SSN, simultaneously switching noise) between the supply voltage and the ground voltage includes component(s) with frequency (or frequencies) equal to the resonance frequency (or frequencies) of power plane and ground plane, the component(s) will be amplified due to resonance, and consequently impact normal operation of electric circuit, e.g., lower signal to noise ration (SNR) of signal input/output.

To suppress resonance between power plane and ground plane, there exist some prior arts, e.g., those disclosed in "Design and Modeling of High-Impedance Electromagnetic Surfaces for Switching Noise Suppression in Power Planes" in IEEE trans. on ELECTROMAGNETIC COMPATIBILITY, vol. 47, no. 3, Aug. 2005, by Telesphor Kamgaing et al; "A Systematic Design to Suppress Wideband Ground Bounce Noise in High-Speed Circuits by Electromagnetic-Bandgap-Enhanced Split Powers" in IEEE trans. on MTT, Vol. 54, no. 12, Dec. 2006, by Chien-Lin Wang et al; and Taiwan patents 1318851 and 1369164, etc.

SUMMARY OF THE INVENTION

An objective of the invention is providing a circuit (e.g., 10a or 10b in FIG. 1 or FIG. 7) with an electromagnetic band gap resonance structure; the circuit may be a package substrate of an IC, or a circuit board. The circuit according to the invention may include a first conductor layer (e.g., M1 in FIG. 1 or 7), a second conductor layer (e.g., M2a or M2b in FIG. 1 or 7), a third conductor layer (e.g., M3 in FIG. 1 or 7) and a predetermined number of conductive stands (e.g., V[nx,ny] in FIG. 4 or 8); the second conductor layer may be between the third conductor layer and the first conductor layer. The first conductor layer may be a ground plane for coupling a ground voltage (e.g., Vss in FIG. 1 or 7); the third conductor layer may be a power plane for coupling a supply voltage (e.g., Vdd in FIG. 1 or 7).

The second conductor layer may include a predetermined quantity (one or more) flat units, each flat unit (e.g., U[nx,ny] in FIG. 2 to FIG. 4) may spirally revolve inward from an end (e.g., point P1 in FIG. 3 or 4) to an internal point (e.g., P0 in FIG. 3 or 4), and spirally revolve outward from the internal point to an other end (e.g., point P2 in FIG. 3 or 4). In an embodiment, each flat unit may be formed within a rectangular region (e.g., a region with side lengths Ux and Uy, FIG. 3), and the two ends of each flat unit may respectively locate at opposite corner points of a diagonal line of the rectangular region. Equivalently, each flat unit may be formed by two coils (e.g., Ls1 and Ls2 in FIG. 3), one coil may spirally revolve from one of the two ends to the internal point following a clockwise direction, and the other coil may spirally revolve from the internal point to the other one of the two ends following a counterclockwise direction. Each conductive stand (e.g., V[nx,ny] in FIG. 4) may be associated with one of the predetermined quantity of flat units (e.g., U[nx,ny] in FIG. 4), for connecting the associated flat unit to the first conductor layer.

In an embodiment, the second conductor layer may include a plurality of flat units (e.g., U[1,1] to U[Nx,Ny], FIG. 2) associated to a plurality of conductive stands, and these flat units may be aligned in a matrix. In an embodiment, each flat unit may be connected to the associated conductive stand at a connection point (e.g., P3 in FIG. 4), and the connection point may be between the two ends of each flat unit. In an embodiment, the plurality of flat units may include a first amount of first flat units (e.g., U[3,1] to U[4,4] in FIG. 9) and a second amount of second flat units (e.g., U[1,1] to U[2,4] in FIG. 9). Each first flat unit (e.g., U[nx1,ny1] in FIG. 8) is connected to the associated conductive stand (e.g., V[nx1,ny1] in FIG. 8) at a connection point, and the connection point is between the two ends of each first flat unit; for example, the connection point may be a geometric center of the two ends. Each second flat unit (e.g., U[nx2,ny2] in FIG. 8) may be connected to the associated conductive stand (e.g., V[nx2,ny2] in FIG. 8) at one of the two ends of each second flat unit. In an embodiment, the first amount may equal the second amount; i.e., the plurality of flat units may include same numbers of first flat units and second flat units.

The flat unit(s) according to the invention may be arranged to suppress a response of at least a frequency, each frequency may associate with a stub length (e.g., Ls in FIG. 8) of each flat unit; the stub length of each flat unit may associate with a route length from the connection point to one of the two ends of each flat unit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
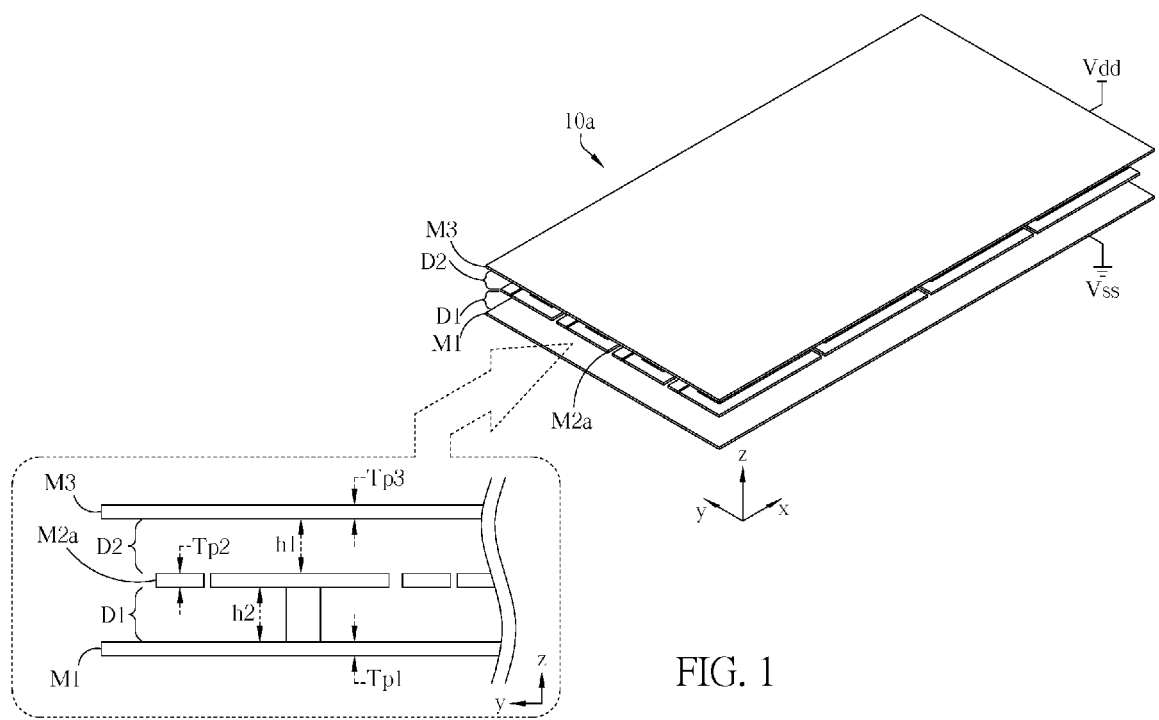
FIG. 1 to FIG. 4 illustrate a circuit according to an embodiment of the invention.

Please refer to FIG. 1 to FIG. 4. FIG. 1 illustrates a circuit 10a according to an embodiment of the invention, which may be a package substrate of an IC, or a circuit board. The circuit 10a may include conductor layers (e.g., metal layers) M1, M2a and M3, and insulation layers (e.g., dielectric layers) D1 and D2. The conductor layer M1 may be a ground plane for coupling a ground voltage Vss. The conductor layer M3 may be a power plane for coupling a supply voltage Vdd. The conductor layers M1, M2a and M3 may extend along x-y plane, and be parallel to each other; the conductor layer M2a may be between the conductor layers M1 and M3. The conductor layers M1 and M2a may be separated by a distance, i.e., a dimension h2, along z-axis; the conductor layers M2a and M3 may be separated by a distance, i.e., a dimension h1, along z-axis. The insulation layer D1 may fill between the conductor layers M1 and M2a, and the insulation layer D2 may fill between the conductor layers M2a and M3, such that the conductor layers M1, M2a and M3 may be mutually insulated. Thicknesses (heights along z-axis) of the conductor layers M1, M2a and M3 may respectively be presented by dimensions Tp1, Tp2 and Tp3.

Figure 2:
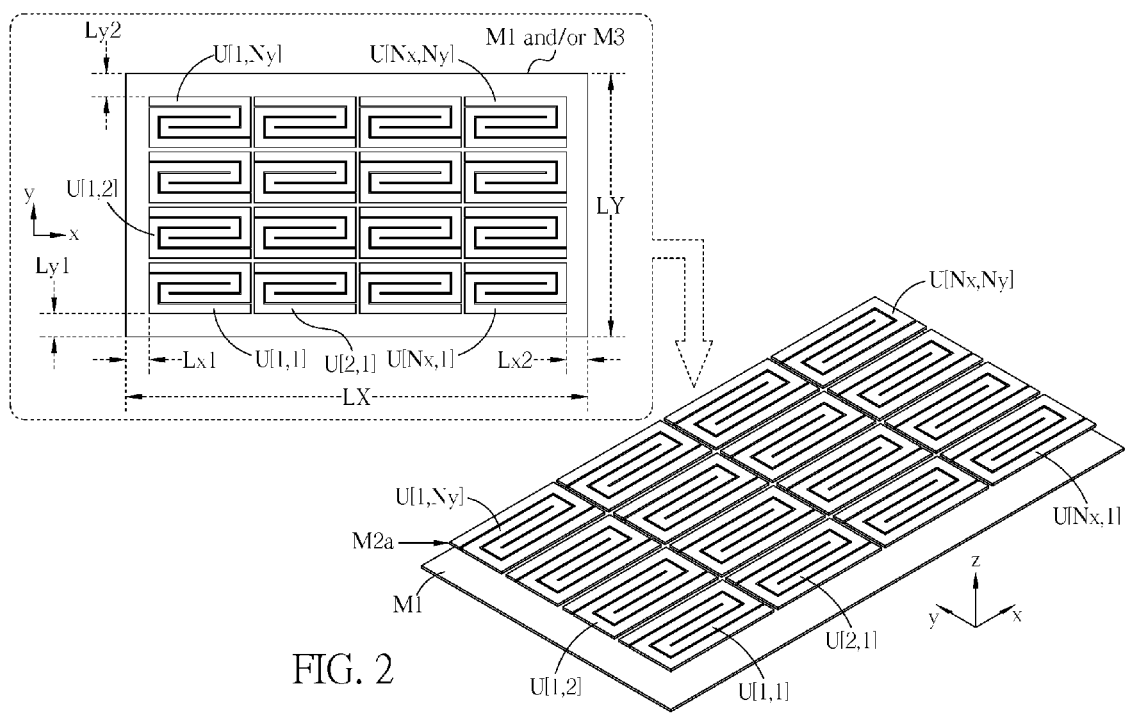

The conductor layer M2a may include a predetermined quantity (one or more) flat units, e.g., Nx by Ny (Nx*Ny) flat units U[1,1], U[1,2] to U[1,Ny], U[2,1] to U[Nx,1], and to U[Nx,Ny], as shown in FIG. 2. The flat units U[1,1] to U[Nx,Ny] may be aligned in matrix along x-axis and y-axis. As shown in FIG. 2, on an x-y plane projection, an area where the flat units U[1,1] to U[Nx,Ny] distribute may be smaller than the conductor layer(s) M1 and/or M3, and may be respectively offset from four edges of the conductor layer(s) M1 and/or M3 by offset distances denoted by dimensions Lx1, Lx2, Ly1 and Ly2 in FIG. 2.

Figure 3:
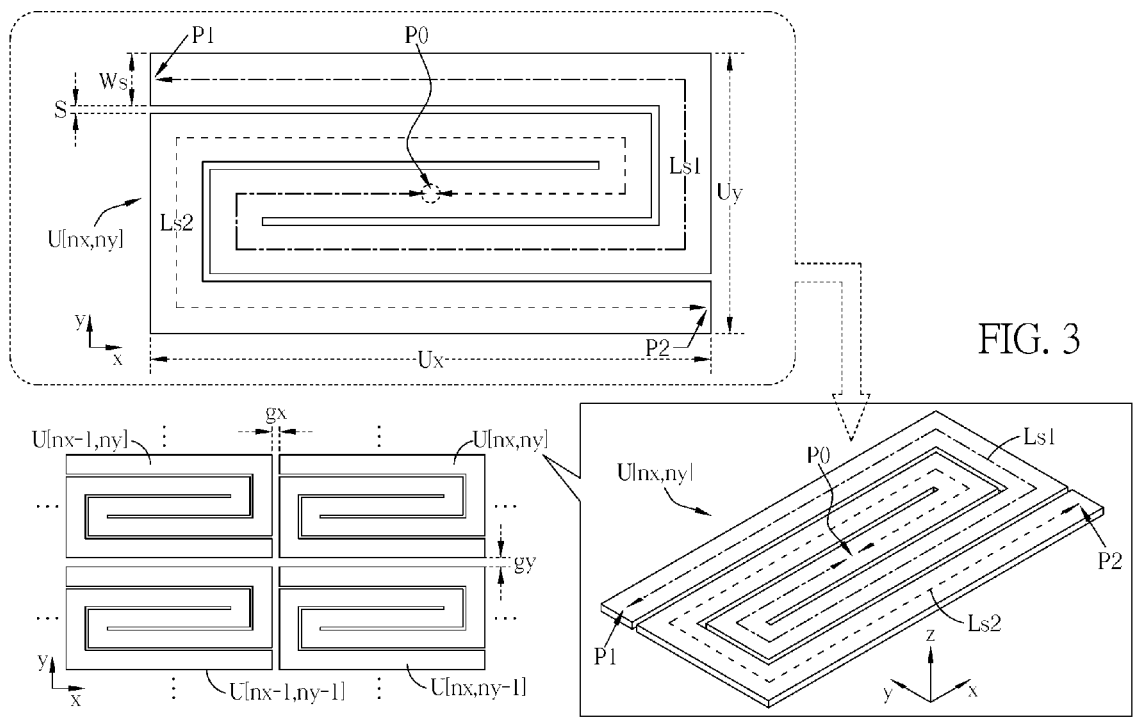

As shown in lower left of FIG. 3, along x-axis, each flat unit U[nx,ny] may be separated from an adjacent flat unit U[nx−1,ny] by a distance denoted by a dimension gx; along y-axis, each flat unit U[nx,ny] may be separated from an adjacent flat unit U[nx,ny−1] by a distance denoted by a dimension gy.

X-y plane projection shapes of the flat units U[1,1] to U[Nx,Ny] may be the same. As shown in upper portion of FIG. 3, each flat unit U[nx,ny] may spirally revolve inward from an end at a point P1 to a point P0 (an internal point of the flat unit U[nx,ny]), and spirally revolve outward from the point P0 to another end at a point P2. Equivalently, each flat unit U[nx,ny] may include two coils Ls1 and Ls2; the coil Ls1 may revolve from the points P1 to P0 following a clockwise direction, and the coil Ls2 may revolve from the points P0 to P2 following a counterclockwise direction; the coils Ls1 and Ls2 may occupy a rectangular region with x-axis length and y-axis width respectively denoted by dimensions Ux and Uy, and the two ends (points P1 and P2) may locate at two opposite corner points of a diagonal line of the rectangular region.

A cross-sectional size of the coils Ls1 and Ls2 may be denoted by a dimension Ws, and adjacent parallel revolving segments of the coils may be separated by a distance denoted by a dimension S. In an embodiment, the point P0 may be a center (a geometric center) of the points P1 and P2; that is, lengths of the coils Ls1 and Ls2 may be equal.

Figure 4:
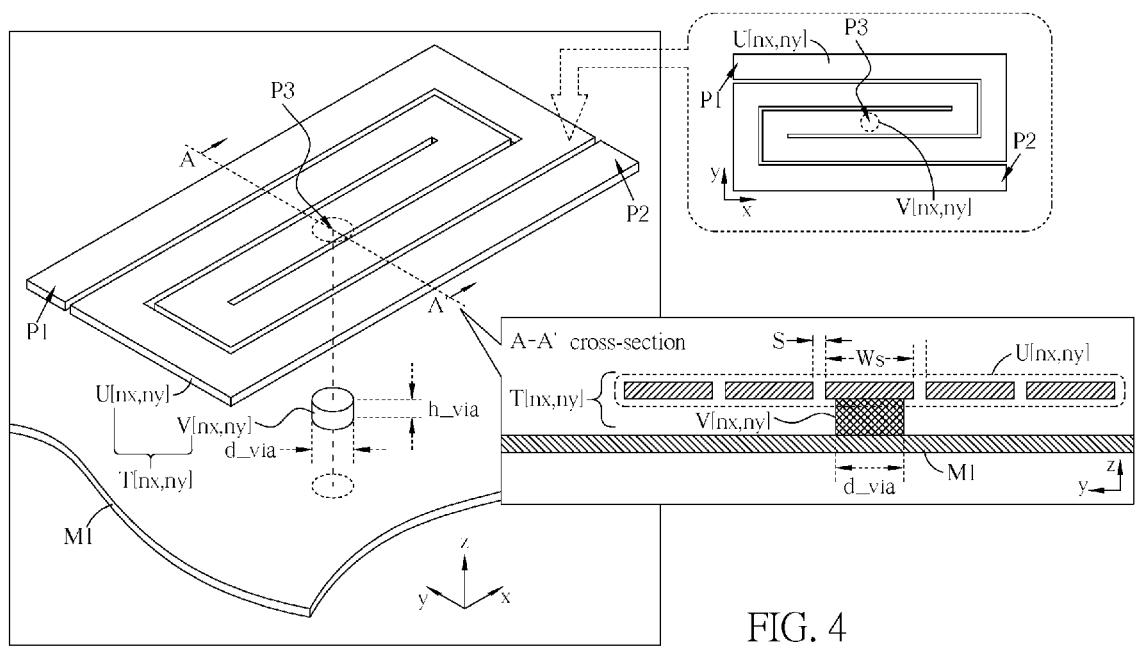

As shown in FIG. 4, the circuit 10a may further include Nx by Ny conductive stands, each conductive stand (e.g., conductive via) V[nx,ny] may be associated with a flat unit U[nx,ny], and may be connected to an inner point P3 (a connection point) of the associated flat unit U[nx,ny] and the conductor layer M1 respectively at two terminals of the conductive stand V[nx,ny], so the conductive stand V[nx,ny] may connect the flat unit U[nx,ny] to the conductor layer M1. For example, each conductive stand V[nx,ny] may be a cylinder with x-y plane cross-section size (e.g., diameter) denoted by a dimension d_via, and a height (z-axis length) denoted by a dimension h_via. In an embodiment, the dimension h_via may be smaller than the dimension Ws.

In the embodiment shown in FIG. 4, the connection point P3 where the conductive stand V[nx,ny] connects the flat unit U[nx,ny] may locate between the two end points P1 and P2 of the flat unit U[nx,ny]. For example, the connection point P3 may be a center of the two end points P1 and P2.

As shown in FIG. 4, each flat unit U[nx,ny] and its associated conductive stand V[nx,ny] may be collectively regarded as a structure unit T[nx,ny]. Accordingly, a flat electromagnetic band gap resonance structure may be formed by gathering Nx*Ny structure units T[1,1] to T[Nx,Ny]. Because of the additional electromagnetic band gap resonance structure arranged between the conductor layers M1 and M3 according to the invention, resonance between the power plane (the conductor layer M3) and the ground plane (the conductor layer M1) may be effectively suppressed.

If there is no electromagnetic band gap resonance structure between the power plane and the ground plane except filled insulation dielectric material, a resonance frequency may be expressed by: $f\_intrinsic[m,n]=c*\sqrt{((m/Ly)^2+(n/Lx)^2)}/(2*\sqrt{(er)})$, where the quantity c is speed of light, the dimension Lx and Ly respectively represent length and width of the power/ground plane (FIG. 2), the quantity er is relative permittivity of the dielectric material, and the numbers m and n may be integers representing wave modes. For example, if the dimensions LX and LY respectively equal 19 mm and 10 mm, the relative permittivity of the dielectric material equals 3.4 with loss tangent 0.017, then the lowest resonance frequency (i.e., f_intrinsic[0,1] with the wave mode numbers m and n respectively equal to 0 an 1) between the power plane and the ground plane will approximately be 4.3 GHz.

If there includes the electromagnetic band gap resonance structure formed by the structure units T[nx,ny] between the power plane and the ground plane, response of a frequency f_FSEBG may be suppressed between the power plane and the ground plane, wherein the frequency f_FSEBG may be approximated by: $f\_FSEBG=c/(4*Ls*\sqrt{(er)})$; the quantity Ls may represent, in each flat unit U[nx,ny], a route length revolving from the connection point P3 to an end point (P1 or P2) along the coil(s) of the flat unit U[nx,ny], and may be regarded as a stub length. For example, if the connection point P3 locates in middle of the two end points P1 and P2, then the two coils Ls1 and Ls2 of the flat unit U[nx,ny] are of equal lengths, and the stub length Ls may therefore equal length of the coil Ls1 or Ls2. Alternatively, if the connection point P3 locates at (overlaps) the end point P1, then the stub length Ls may equal a total length of the coils Ls1 and Ls2, i.e., the route length revolving from the connection point P3 to the other end point P2 along the two coils Ls1 and Ls2.

Figure 5:
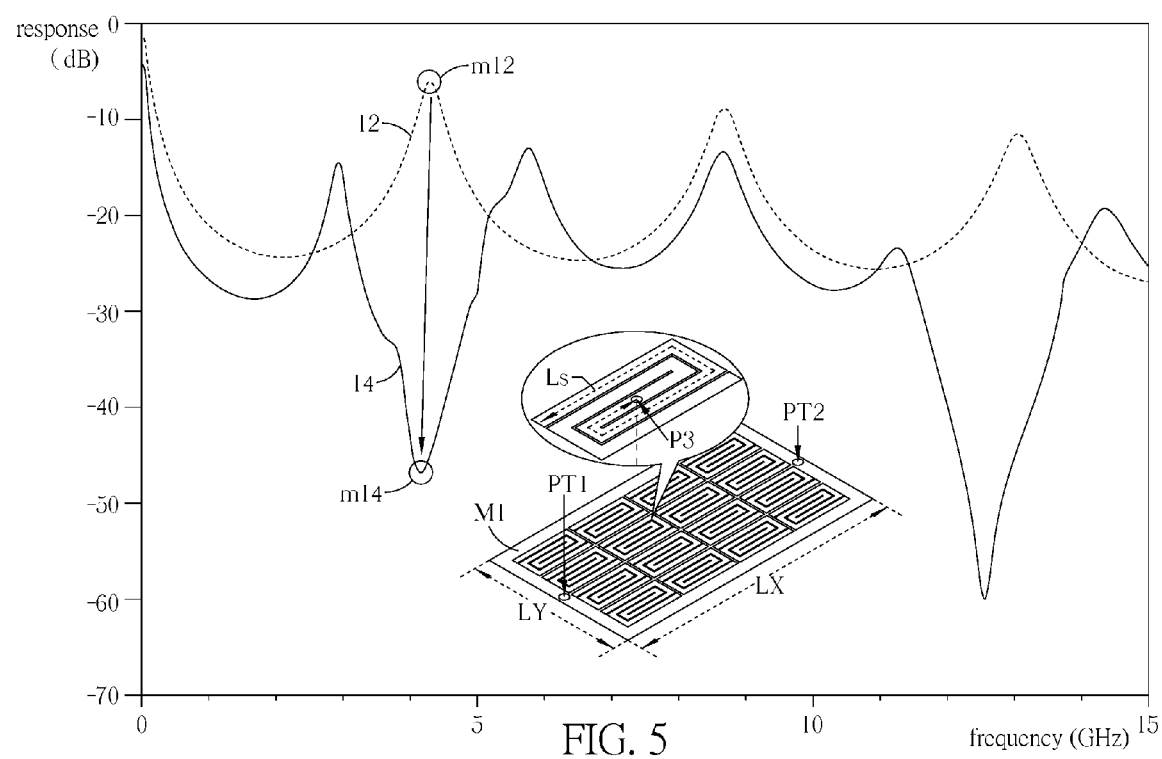
FIG. 5 and FIG. 6 illustrate resonance suppression examples according to the invention.

Along with FIG. 1 to FIG. 4, please refer to FIG. 5 illustrating a resonance suppression example of the electromagnetic band gap resonance structure of the invention; the transverse axis of FIG. 5 is frequency (in GHz) and the longitudinal axis is magnitude of response (in dB). For example, the response in FIG. 5 may refer to two-port network parameter S21 between two ports PT1 and PT2, and may hence equal v2/v1, where the quantity v1 may be a voltage fluctuation at the port PT1, and the quantity v2 may be a resultant voltage at the port PT2 in response to the voltage v1. As shown in FIG. 5, the ports PT1 and PT2 may respectively locate at opposite sides of the conductor layer M1.

In FIG. 5, a response between the power plane and the ground plane in absence of the electromagnetic band gap resonance structure may be demonstrated by a curve 12, which shows a local extreme (peak), e.g., the extreme m12. As previously mentioned, if the dimensions LX and LY of the ground plane respectively equal 19 mm and 10 mm, a fundamental resonance frequency f_intrinsic[0,1] may equal 4.3 GHz, i.e., the frequency where the extreme m12 locates. An adjacent resonance frequency f_intrinsic[0,2] may locate at around 8.7 GHz.

To suppress resonance between power plane and ground plane, the electromagnetic band gap resonance structure according to the invention may be included between the power plane and the ground plane. In the example of FIG. 5, four by four structure units T[1,1] to T[4,4] (i.e., (Nx,Ny)= (4,4)) are utilized to form the flat electromagnetic band gap resonance structure; in each flat unit U[x,y], the connection point P3 where the flat unit U[nx,ny] and the associated conductive stand V[nx,ny] connect may locate between the two end points of the flat unit U[nx,ny], e.g., may be a geometric center of the two end points of the flat unit U[nx,ny]. If the distance separating the power plane and the ground plane is kept unchanged (as the curve 12), and the stub length Ls of each flat unit is set equal to 10.1 mm by design of dimensions, then the response from the ports PT1 to PT2 may be represented by a curve 14. The curve 14 forms a notch as an extreme m14, and the frequency where the extreme m14 locates may be accurately predicted by the frequency f_FSEBG, which may approximately equal 4.15 GHz. In other words, at the frequency f_intrinsic[0,1], the original peak response extreme m12 (in absence of the electromagnetic band gap resonance structure), approximately equal to −6.4 dB in magnitude, may be suppressed to the notch extreme m14, approximately equal to −46.8 dB, by including the electromagnetic band gap resonance structure according to the invention. Accordingly, the resonance frequency f_intrinsic[0,1] may be effectively suppressed.

That is, according to dimensions of the power/ground plane, the resonance frequency (or frequencies) may be estimated, so a target frequency to be suppressed (e.g., the frequency f_intrinsic[0,1] or f_intrinsic[1,0]) may be obtained. Then, dimension(s) of each flat unit U[nx,ny] (e.g., the dimension(s) Ux, Uy, etc. in FIG. 3) and location of the connection point may be designed (determined), such that the frequency f_FSEBG provide by the stub length Ls may approach the target frequency. Thus, resonance at the target frequency may be suppressed by adopting the electromagnetic band gap resonance structure according to the invention.

As another example, if both the dimensions LX and LY of the power/ground plane equal 25 mm, then the fundamental resonance frequency f_intrinsic[0,1] will approach 3.3 GHz. For such example, the stub length Ls may be set equal to 13 mm by dimension design, so a peak at 3.3 GHz may be suppressed to a notch.

Figure 6:
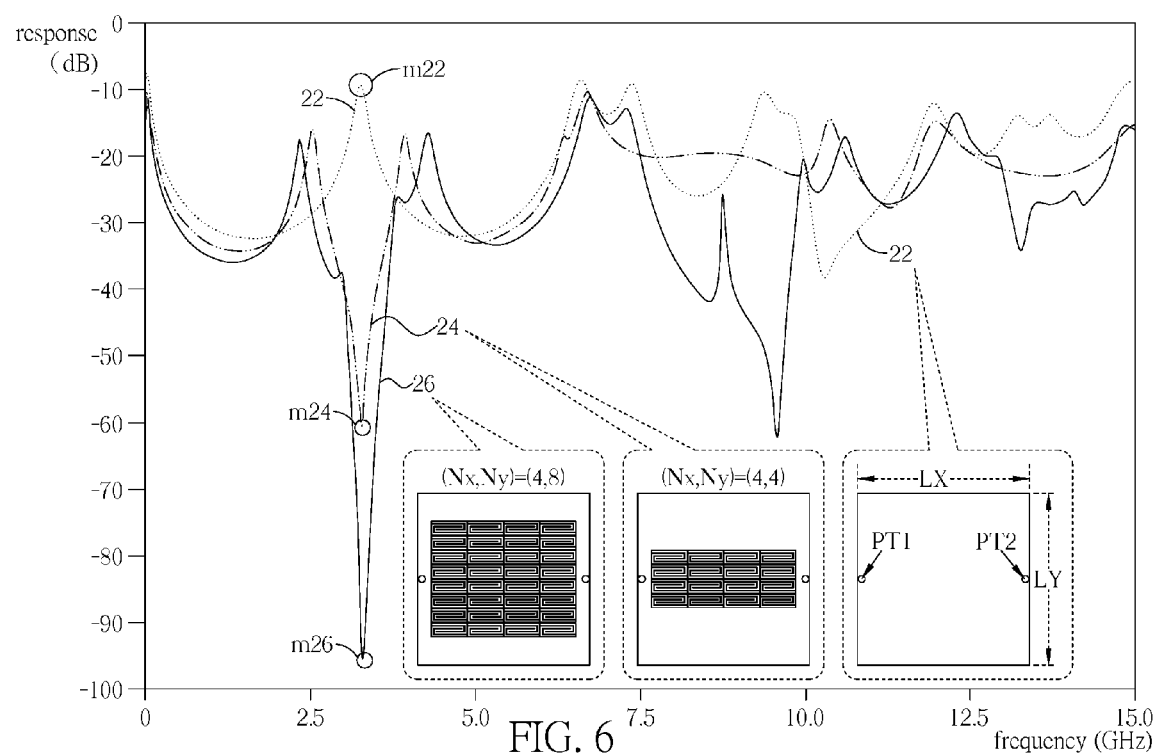

While applying the technique of the invention, not only the dimensions Ux and Uy (FIG. 3) of each flat unit U[nx,ny] may be adjusted to manipulate the stub length Ls measured from the connection point to an end point, but also other parameters and/or dimensions may be adjusted to control effect of resonance suppression. Please refer to an example shown in FIG. 6, wherein quantity of structure units is adjusted to control effect of resonance suppression. As shown in FIG. 6, while both the dimensions LX and LY of the ground plane equal 25 mm, if there is no electromagnetic band gap resonance structure between the ground plane and the power plane, then a response between ports PT1 and PT2 may be demonstrated by a curve 22, which forms an extreme m22 (about −9.6 dB) at the frequency f_intrinsic[0,1] (about 3.3 GHz). If four by four structure units T[1,1] to T[4,4] (i.e., (Nx,Ny)=(4,4)) are adopted to form a flat electromagnetic band gap resonance structure between the ground plane and the power plane, each flat unit U[nx,ny] connects to the associated conductive stand V[nx,ny] at a central point, and the stub length Ls is designed equal to 13 mm, then the response between the ports PT1 and PT2 may be demonstrated by a curve 24. The curve 24 shows suppression of response around the frequency f_intrinsic[0, 1], and forms a notch extreme m24 (about −61.4 dB).

On the other hand, If four by eight structure units T[1,1] to T[4,8] (i.e., (Nx,Ny)=(4,8)) are alternatively adopted to form the flat electromagnetic band gap resonance structure between the ground plane and the power plane, each flat unit U[nx,ny] also connects to the associated conductive stand V[nx,ny] at a central point, and the stub length Ls is also set equal to 13 mm, then the response between the ports PT1 and PT2 may be demonstrated by a curve 26. The curve 26 shows further suppression of response around the frequency f_intrinsic[0,1], and forms a lower notch extreme m26 (about −95.9 dB).

While applying the electromagnetic band gap resonance structure of the invention, all associated dimensions and parameters may be freely and flexibly adjusted according to requirement of resonance suppression, including (but not limited to) the dimensions h1, h2 and Tp2 (FIG. 1), material of the insulation layers D1 and D2 (FIG. 1), the offset dimensions Lx1, Lx2, Ly1 and Ly2 (FIG. 2), the row and column quantities Nx and Ny (FIG. 2) of the structure units T[nx,ny], the length and width dimensions Ux and Uy of each flat unit U[nx,ny] (FIG. 3), the cross-sectional dimension Ws of the spiral coils and the separation dimension S (FIG. 3), location (position) of the connection point P3, and the diameter dimension d_via and height dimension h_via of each conductive stand V[nx,ny] (FIG. 4), etc.

Figure 7:
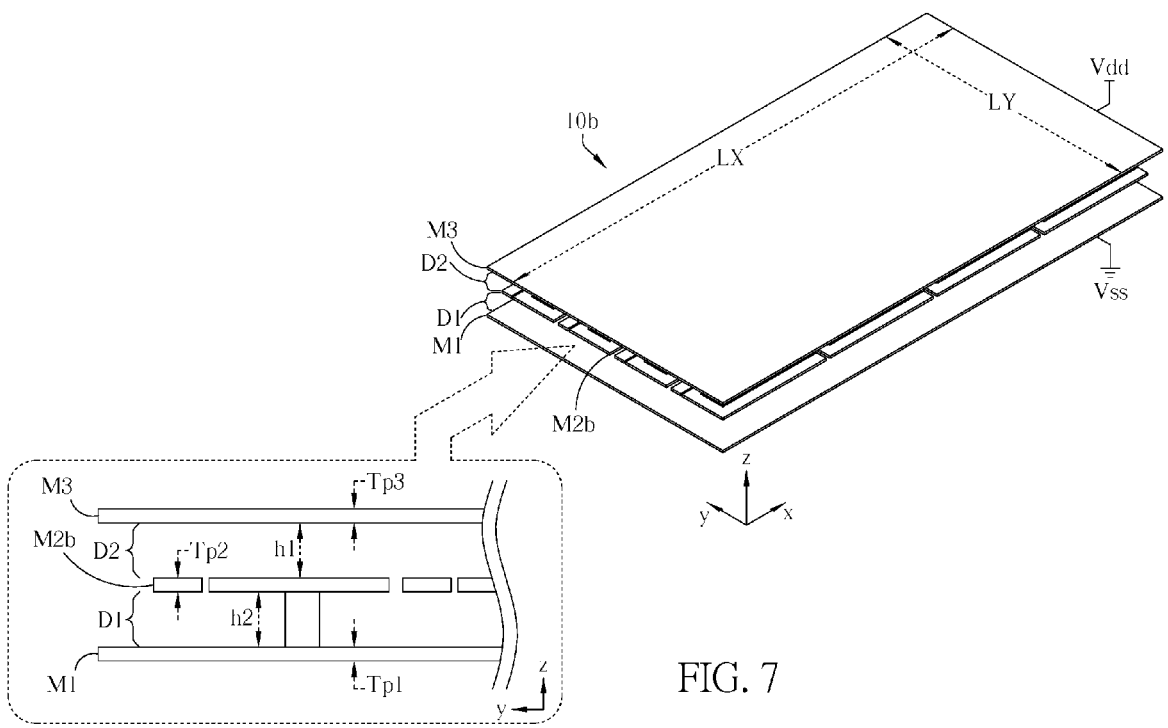
FIG. 7 and FIG. 8 illustrate a circuit according to an embodiment of the invention.
Figure 8:
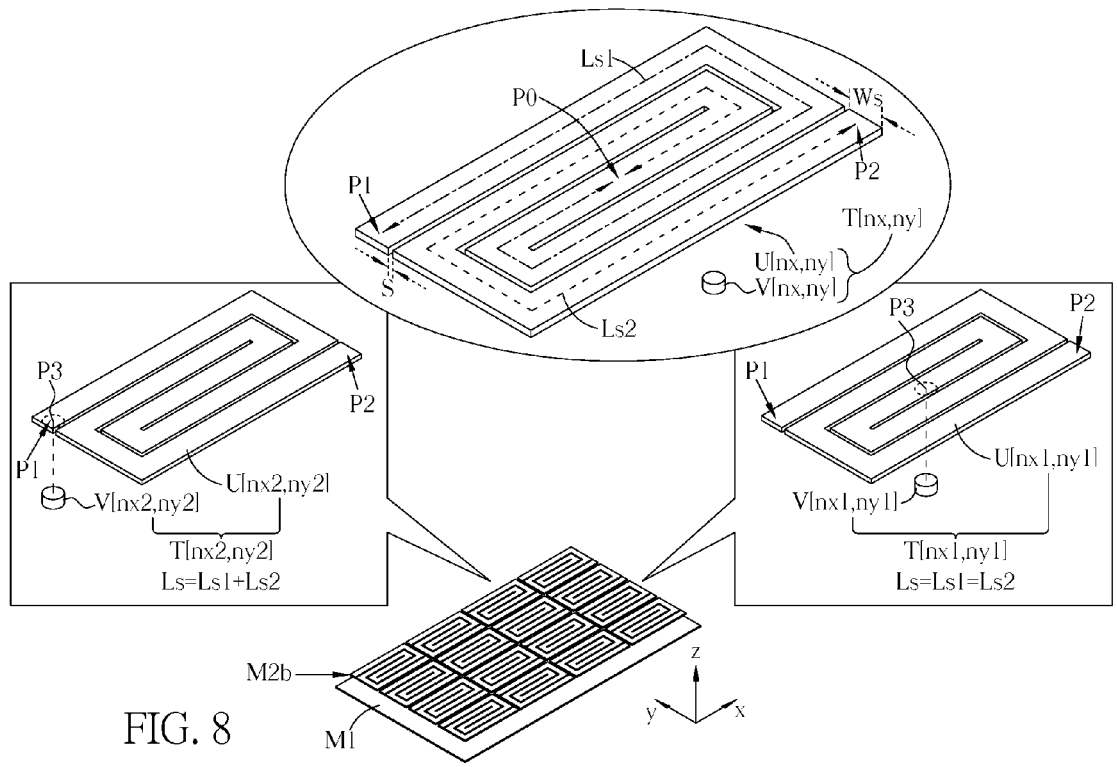
Figure 9:
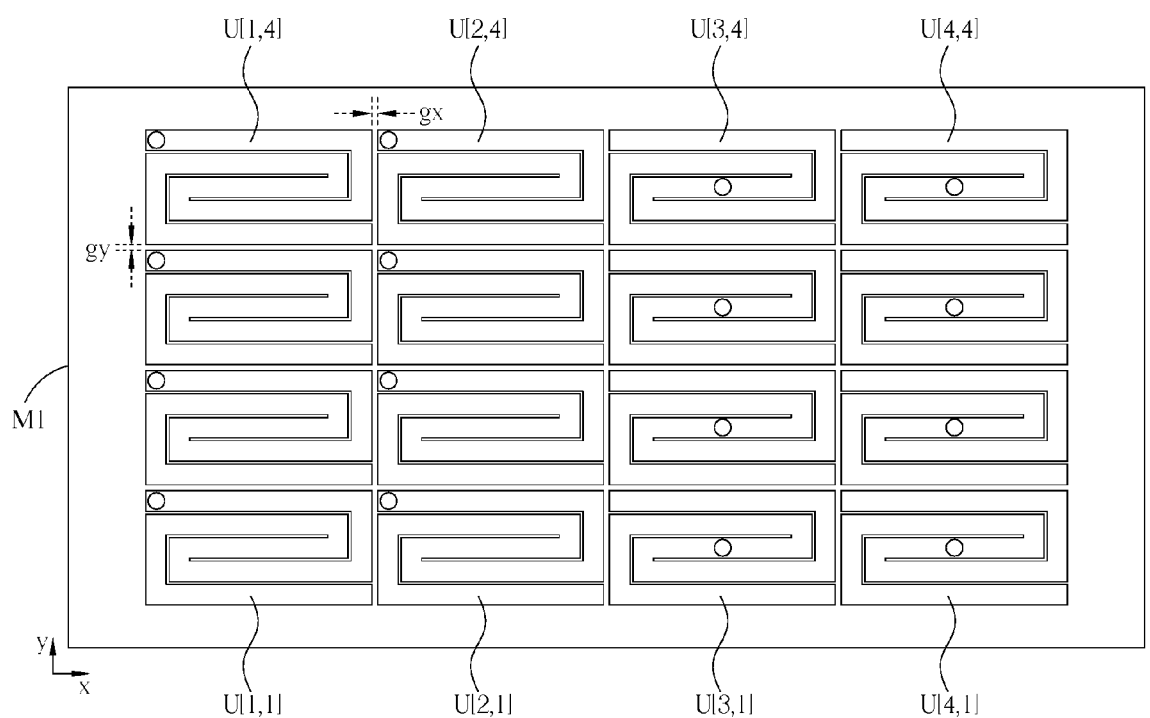
FIG. 9 illustrates a configuration example of the circuit shown in FIG. 8.

Please refer to FIG. 7 to FIG. 9. FIG. 7 illustrates a circuit 10b according to an embodiment of the invention, which may be a package substrate of an IC, or a circuit board. Similar to the circuit 10a shown in FIG. 1 to FIG. 4, the circuit 10b may also include conductor layers M1, M2b and M3, along with insulation layers D1 and D2. The conductor layer M1 may be a ground plane for coupling a ground voltage Vss. The conductor layer M3 may be a power plane for coupling a supply voltage Vdd. The conductor layers M1, M2b and M3 may extend along x-y plane, and be parallel to each other; the conductor layer M2b may be between the conductor layers M1 and M3. The conductor layers M1 and M2b may be separated by a distance, i.e., a dimension h2, along z-axis; the conductor layers M2b and M3 may be separated by a distance, i.e., a dimension h1, along z-axis. The insulation layer D1 may fill between the conductor layers M1 and M2b, and the insulation layer D2 may fill between the conductor layers M2b and M3, such that the conductor layers M1, M2b and M3 may be mutually insulated. Thicknesses (heights along z-axis) of the conductor layers M1, M2a and M3 may respectively be presented by dimensions Tp1, Tp2 and Tp3.

As shown in FIG. 8, the conductor layer M2b may include a predetermined quantity (one or more) flat units U[nx,ny]; similar to the flat unit U[nx,ny] in FIG. 3, each flat unit U[nx,ny] in FIG. 8 may be formed by a revolving microstrip line; the microstrip line may be of a width dimension Ws, and may spirally revolve inward from an end at a point P1 to an internal point P0, and spirally revolve outward from the point P0 to another end at a point P2. Equivalently, each flat unit U[nx,ny] may include two rectangular coils Ls1 and Ls2; the coil Ls1 may revolve from the points P1 to P0 following a clockwise direction, and the coil Ls2 may revolve from the points P0 to P2 following a counterclockwise direction; adjacent parallel revolving segments of the coils may be separated by a distance denoted by a dimension S.

In the embodiment shown in FIG. 8, each flat unit U[nx,ny] of the conductor layer M2b may also be connected to the conductor layer M1 by an associated conductive stand V[nx,ny]; the flat unit U[nx,ny] and the conductive stand V[nx,ny] collectively form a structure unit T[nx,ny], and an electromagnetic band gap resonance structure may be formed by organizing one or more structure units T[nx,ny]. However, as shown in FIG. 8, all the structure units T[nx,ny] may include one or more first kind structure units T[nx1,ny1], and one or more second kind structure units T[nx2,ny2]. In each first kind structure unit T[nx1,ny1], the connection point P3 where the flat unit U[nx1,ny1] connects the conductive stand V[nx1,ny1] may locate at a central point of the flat unit U[nx1,ny1], i.e., a central point of the two end point P1 and P2. Accordingly, for each first kind structure unit T[nx1,ny1], a stub length Ls revolving from the connection point P3 to an end point (e.g., the point P1) may equal a length of the coil Ls1 or Ls2.

On the other hand, in each second kind structure unit T[nx2,ny2], the connection point P3 where the flat unit U[nx2,ny2] connects the conductive stand V[nx2,ny2] may locate at an end (a corner) point of the flat unit U[nx2,ny2], e.g., the end point P1. Therefore, for each second kind structure unit T[nx2,ny2], a stub length Ls revolving from the connection point P3 to an end point (i.e., the point P2) may equal a total length of the coils Ls1 and Ls2. That is, the stub length Ls from the connection point to the end point of each second kind structure unit may be twice of the stub length Ls of each first kind structure unit.

Continuing the embodiment shown in FIG. 7 and FIG. 8, please refer to FIG. 9 illustrating an embodiment in which different kinds of structure units are mixed to form a flat electromagnetic band gap resonance structure. The embodiment shown in FIG. 9 may include four by four flat units U[1,1] to U[4,4] aligned in matrix, with separation distances between adjacent flat units denoted by dimensions gx and gy. Among the flat units, the flat units U[1,1] to U[1,4] and U[2,1] to U[2,4] may be utilized to implement the corner-connected second kind structure units; that is, each of these flat units connects the associated conductive stand to be connected to the conductor layer M1 at the end point. On the contrary, the flat units U[3,1] to U[3,4] and U[4,1] to U[4,4] may be utilized to implement the center-connected first kind structure units; that is, each of these flat units connects the associated conductive stand to be connected to the conductor layer M1 at the central point.

Figure 10:
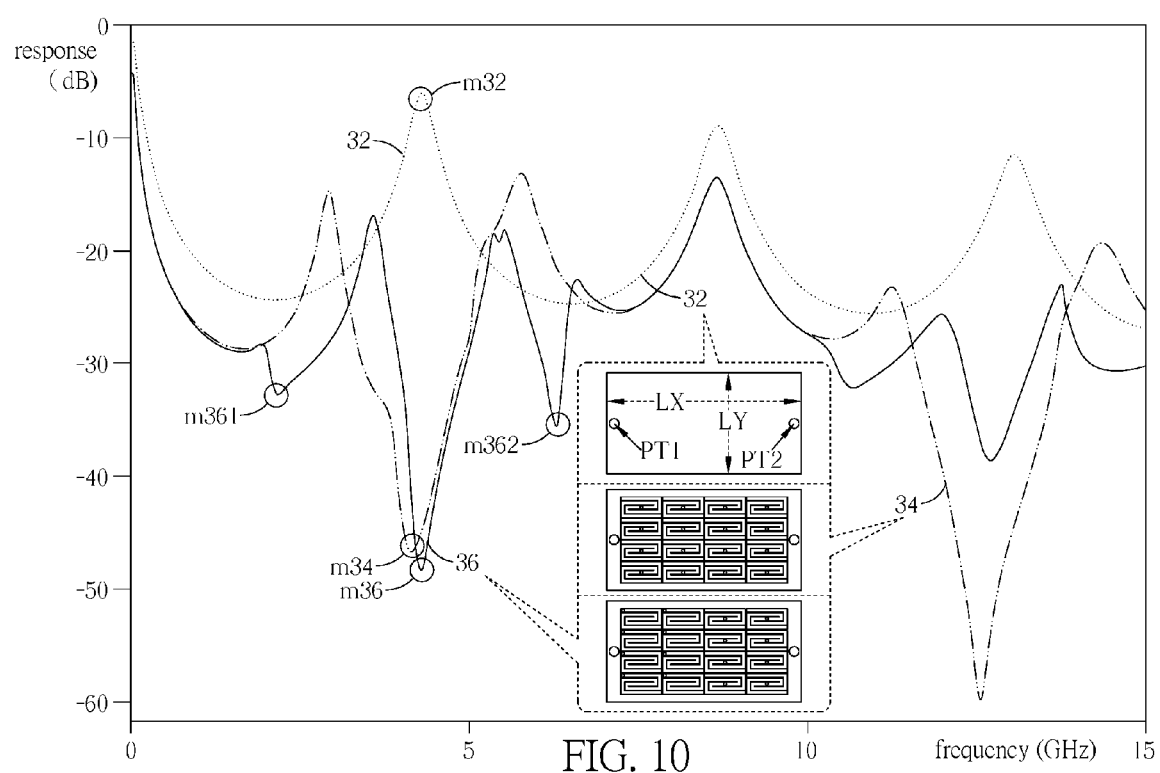
FIG. 10 illustrates resonance suppression examples according to the invention.

Please refer to FIG. 10 illustrating an example demonstration how locations of the connection points may influent response. As shown in FIG. 10, while the dimensions LX and LY of the ground plane respectively equal 19 mm and 10 mm, if there is no electromagnetic band gap resonance structure between the ground plane and power plane, then a response between ports PT1 and PT2 may be demonstrated by a curve 32, which forms a resonance extreme m32 at the frequency f_intrinsic[0,1] (about 4.3 GHz). If four by four center-connected first kind structure units are utilized to form the flat electromagnetic band gap resonance structure with each flat unit U[nx,ny] connecting the conductive stand V[nx,ny] at the center point, and the stub length Ls from the connection point to the end point of each flat unit equal to 10.1 mm, then a resultant response between the ports PT1 and PT2 may be demonstrated by a curve 34. The curve 34 may suppress resonance around the frequency f_intrinsic[0,1] and form a notch extreme m34.

On the other hand, if the flat electromagnetic band gap resonance structure adopts the mixed arrangement shown in FIG. 9 to include four by two center-connected first kind structure units (with stub length Ls equal to 10.1 mm) and other four by two corner-connected second kind structure units (with stub length Ls equal to 20.2 mm) in total four by four structure units, then a response between the ports PT1 and PT2 may be demonstrated by a curve 36. The curve 36 may also suppress response around the frequency f_intrinsic[0,1] to form a notch extreme m36 (about −48.3 dB in magnitude, at about 4.3 GHz in frequency). Because the flat electromagnetic band gap resonance structure adopts mixed arrangement of two kinds of structure units, the curve 36 may provide additional two extremes (notches) m361 and m362. The extreme m361 may be about −32.4 dB in magnitude, at about 2.25 GHz in frequency; the extreme m362 may be about −35.8 dB in magnitude, at about 6.3 GHz in frequency. It is therefore understood that the corner-connected second kind structure units may provide suppression of resonance harmonics, and suppress multiple resonance frequencies along with the center-connected first kind structure units.

To sum up, comparing to prior arts, advantages of the invention may be discussed as follows. Because the flat electromagnetic band gap resonance structure according to the invention may effective suppress resonance between power plane and ground plane, usage of decoupling capacitors may be avoided, or reduced (with reduced quantity and/or smaller area of decoupling capacitors), so as to lower cost. According to the technique of the invention, the frequency (or frequencies) where resonance may be suppressed may be precisely estimated by the stub length Ls of each flat unit, hence circuit design may become very easy, since complicated inductance and capacitance modeling, extraction and simulation may no longer be needed. The invention may also mix different kinds of structure units to form the flat electromagnetic band gap resonance structure, so as to suppress multiple resonance frequencies; in different kinds of structure units, the flat units may be connected to the ground plane respectively by conductive stands at different connection points, and the stub length Ls from the connection point to the end point may be different.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A circuit with electromagnetic band gap resonance structure, comprising:
   a first conductor layer;
   a second conductor layer comprising a predetermined quantity of flat units; each of the flat units spirally revolving inward from an end to an internal point, and spirally revolving outward from the internal point to another end; and
   a predetermined number of conductive stands, each of the conductive stands associated with one of the predetermined quantity of flat units, for connecting the associated flat unit to the first conductor layer;
   wherein the predetermined quantity of flat units are arranged to suppress a response of at least a frequency, each said frequency associates with a stub length of each of the flat units; each of the flat units are connected to the associated conductive stand at a connection point, and the stub length of each of the flat units associated with a route length from the connection point to one of the two ends of each of the flat units.

2. The circuit of claim 1 further comprising:
   a third conductor layer; wherein the second conductor layer is between the third conductor layer and the first conductor layer.

3. The circuit of claim 2, wherein the first conductor layer is a ground plane for coupling a ground voltage, and the third conductor layer is a power plane for coupling a supply voltage.

4. The circuit of claim 1, wherein each of the flat units are formed within a rectangular region of the second conductor layer, and the two ends of each of the flat units respectively locate at opposite corner points of a diagonal line of the rectangular region.

5. The circuit of claim 4, wherein the predetermined quantity of flat units are aligned in a matrix.

6. The circuit of claim 1, wherein the connection point of each of the flat units is between the two ends of each of the flat units.

7. The circuit of claim 1, wherein the predetermined quantity of flat units includes at least a first flat unit and at least a second flat unit; the connection point of each of the first flat units is between the two ends of each of the first flat units; and the connection point of each of the second flat units is at one of the two ends of each of the second flat units.

8. The circuit of claim 7, wherein the predetermined quantity of flat units includes same numbers of the first flat units and the second flat units.

9. The circuit of claim 1, wherein each of the flat units comprises:
   a first coil spirally revolving from one of the two ends to the internal point following a clockwise direction; and
   a second coil spirally revolving from the internal point to the other one of the two ends following a counterclockwise direction.

10. The circuit of claim 1 being a substrate of an integrated circuit or a circuit board.

\* \* \* \* \*